United States Patent [19]

Bertrand et al.

[11] 4,345,207

[45] Aug. 17, 1982

[54] METHOD AND APPARATUS FOR OBTAINING ENHANCED NMR SIGNALS

[75] Inventors: Richard D. Bertrand, Dearborn Heights, Mich.; Gerard C. Chingas; Allen N. Garroway, both of Oxon Hill, Md.; William B. Moniz, Clinton, Md.

[73] Assignee: The United States of America as represented by the Secretary of the Navy, Washington, D.C.

[21] Appl. No.: 143,398

[22] Filed: Apr. 24, 1980

[51] Int. Cl.³ .............................................. G01N 27/00
[52] U.S. Cl. ..................................... 324/308; 324/314
[58] Field of Search ............... 324/312, 308, 313, 307, 324/311, 314, 315

[56] References Cited

U.S. PATENT DOCUMENTS

| 3,085,195 | 4/1963 | Anderson | 324/313 |
| 3,792,346 | 2/1974 | Gibby | 324/314 |
| 4,050,009 | 9/1977 | Sagalgn et al. | 324/308 |
| 4,068,161 | 1/1978 | Ernst | 324/312 |
| 4,110,681 | 8/1978 | Hofer et al. | 324/313 |

Primary Examiner—Michael J. Tokar
Attorney, Agent, or Firm—Robert F. Beers; William T. Ellis; Thomas E. McDonnell

[57] ABSTRACT

A method and device of NMR spectroscopic analysis of liquids whereby magnetization of the spins of one nuclear species in spin-locked along a certain direction and the spin polarization of this species is transferred to a second species through the modulation of the amplitude and/or phase of rf fields applied to one or both species. The NMR signal can be detected directly from the second species.

17 Claims, 12 Drawing Figures

TIME ⟶

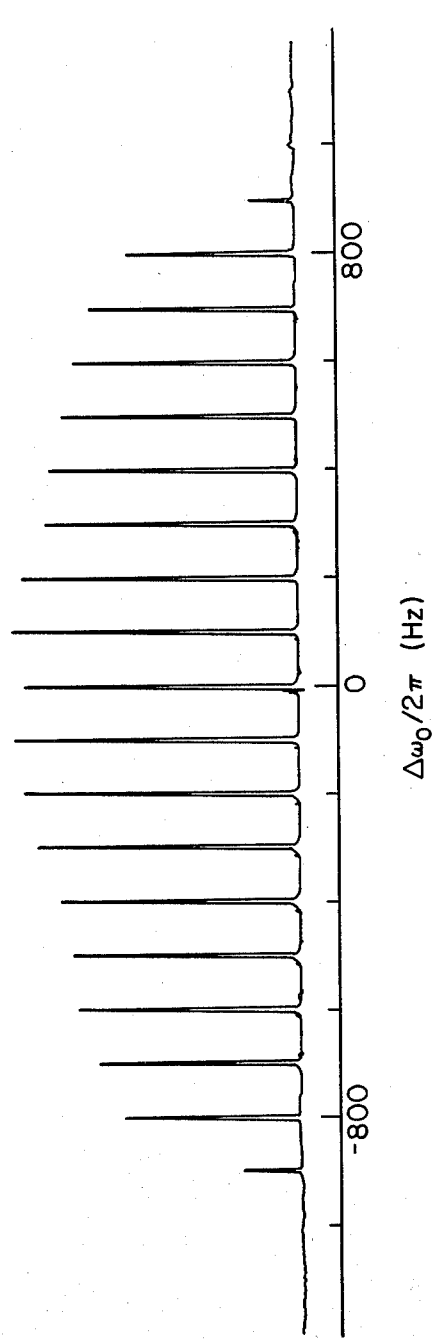
FIG. 6
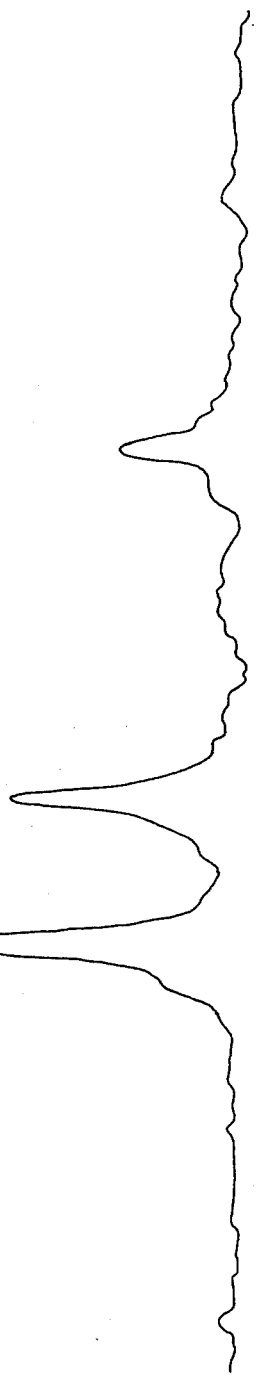
FIG. 7

METHOD AND APPARATUS FOR OBTAINING ENHANCED NMR SIGNALS

BACKGROUND OF THE INVENTION

The present invention generally pertains to the nuclear magnetic resonance (NMR) technique of analytical spectroscopy, and particularly to a method of enhancing NMR signals in liquids.

Nuclear magnetic resonance is a well-established spectroscopic method which uses the magnetic interactions of nuclei with their surroundings to provide chemical and structural information about materials. In general, a substance contains many nuclear species (elemental isotopes), each species being present in a certain abundance and each characterized by a magnetogyric ratio $\gamma$. In the presence of an applied magnetic field of strength $B_o$, these nuclei will precess at individual Larmor frequencies: $\omega_o = \gamma(1-\sigma)B_o$, where $\sigma$ is the chemical shift parameter which describes the strength of the interaction between a given constituent nucleus and the electrons in the host molecule.

Measurements of $\omega_o$ and hence $\sigma$ are major sources of NMR analytical information. The value of $\sigma$ for one nuclear species provides information about the chemical structure of the host molecule. Additionally, when different nuclei in the sample are coupled magnetically, the precession frequency is altered, either broadened over a continuous range or split into discrete components. Such structure provides further information about the chemical environment of the nuclear species being observed.

Often it is necessary to obtain NMR spectra of species which have low isotopic abundance and/or low magnetogyric ratio $\gamma$. Species having these properties generally have weak signal strength, which necessitates accumulating a large number of successive signals to develop the signal-to-noise ratio to a useable level. Accumulation times for these averages can be as long as several hours and very often can stretch into days. Long accumulation times are detrimental because lengthy analyses occupy an extremely expensive apparatus; furthermore, transient chemical effects may be unobservable if the specimen is chemically unstable over the course of the accumulation.

Many techniques have been developed to solve the problem of long accumulation times. Since the signal-to-noise ratio improves in proportion to the square root of the number of accumulations, the accumulation time is more or less inversely proportional to the square of the strength of the available signal. Therefore a mere doubling of signal strength reduces the required acquisition time by a factor of four. Consequently, much effort has been devoted to increasing the strength of the signals by employing higher magnetic fields ($B_o$) which increase the spin polarization and by using larger samples containing more observable spins.

Additional signal strength can be obtained when the nuclei under observation are magnetically coupled to a species having a higher $\gamma$. Such enhanced polarization is obtained by magnetization transfer from the higher $\gamma$ species (referred to hereinafter as the I spins) to those with the lower $\gamma$ (referred to hereinafter as the S spins). The several variations of this general technique rely on the existence of some type of spin-spin coupling between the I and S species for their operation.

In solids, dipolar interaction is the dominant coupling mechanism. Its long range couples all the spins in the sample into sets of thermal reservoirs, each characterized by a particular spin temperature. Polarization transfer here may proceed by thermal equilibration, whereby one establishes contact between hot (low polarization) S and cool (high polarization) I reservoirs. Heat flows from the S to the I spins until equilibrium has been achieved, whereupon the increased polarization of the S species may be observed. The statistical character of the dipolar coupling leads to a monotonic thermal transfer of polarization to the final equilibrium value. Owing to the large dipolar strength, equilibration occurs in times on the order of 20–50 $\mu s$ for the case of transfer from protons to $^{13}C$ nuclei.

In liquids, on the other hand, the anisotropic dipolar interaction is greatly reduced by rapid molecular motion, so that the weaker indirect J coupling becomes dominant. In contrast to the dipolar coupling which operates directly between spins, the J coupling operates by polarization of electrons in chemical bonds. It is characterized by a discrete set of intramolecular spin-spin coupling strengths involving at most a few nuclei, which leads to important differences between the behavior of coupled spins in liquids and solids. The short range of the J coupling leads to oscillations in the polarization transfer accompanied by the development of spin-spin correlations corresponding to mutual precession of the coupled spins. For example in liquids, the polarization oscillates with a period on the order to ten milliseconds for a proton directly bonded to a $^{13}C$ nucleus. Hence, polarization strategies based on the thermal models do not apply. Unlike the solid state case, both the timing of the rf pulses used to provide cross-polarization and adjustment of their amplitudes are critical in order to transfer polarization effectively by J coupling.

One method of liquid state signal enhancement is reported by I. Solomon and N. Bloembergen in *J. Chem. Phys.* 25, 261 (1956). By this technique, the I spins are subjected to steady saturating irradiation, after which the S magnetization is rotated by a $\pi/2$ pulse into the plane transverse to $B_o$ where its precession is detected by a receiver coil. The steady I irradiation generates thermal processes which increase the S magnetization by a factor between 0 and $1 + \frac{1}{2}(\gamma_I/\gamma_S)$ wherein $\gamma_I$ and $\gamma_S$ are the magnetogyric ratios of the I and S species. A drawback of this technique is that this enhancement factor depends, in detail, on various relaxation processes due to the residual dipolar coupling. The rates of these processes are difficult to predict theoretically and measure experimentally. Further, the rates are often quite slow, thereby necessitating long irradiation times and lengthy delays between successive pulses. Another problem occurs if the magnetogyric ratios have opposite signs, as for example in the important case of $^1H$-$^{15}N$ systems; for such systems, the polarization transferred to the S species may cancel its initial thermal value, so that one runs the risk of reducing rather than enhancing the signal. Finally, for systems having large $\gamma_I/\gamma_S$ ratios, the maximum enhancement of $1 + \frac{1}{2}(\gamma_I/\gamma_S)$ is substantially less than the enhancement factor $\gamma_I/\gamma_S$ which other techniques can provide.

A method for using both J and dipolar coupling for transferring polarization is disclosed in S. R. Hartmann and E. L. Hahn in *Phys. Rev.* 128, 2042–53 (1962). The method comprises spin-locking the I spins while simultaneously irradiating the S spins with rf fields having amplitudes which optimally satisfy the condition: $\gamma_I B$-

$_{1I} = \gamma_S B_{1S}$. The presence of the S species is detected indirectly by observing the reduction in the I polarization as the I spins transfer their magnetization to the S spins. The chief shortcoming of this technique occurs in the important case of abundant I nuclei and rare S nuclei: the desired S signal must be inferred from the slight drop in the large I polarization. As expected from a method primarily developed for solid state NMR, other problems exist. This method, when applied to liquids, requires extreme care in adjusting the amplitudes of the rf field. A discussion of these difficulties can be found in A. A. Maudsley, L. Müller, and R. R. Ernst, *J. Magn Res.* 28, 463 (1977). Many other complications peculiar to this technique are not dealt with in Hartmann et al. or in Maudsley et al. because they considered only idealized systems consisting of a single I spin coupled to a single S spin and further assumed irradiation of both species at their Larmor frequencies.

An improvement of the above technique for solids only is disclosed in U.S. Pat. No. 3,792,246 by Gibby et al., filed Nov. 20, 1972. This method proceeds by using the dipolar coupling to transfer heat between various spin systems in solids. The method requires a number of pulse sequences to cool the I spins, to establish thermal contact between the I and S species, thereby cooling the S spins, and to observe the enhanced S polarization generated by the cooling. Unfortunately, this method is not suitable for liquid state NMR since the J coupling in liquids connects only a few spins, unlike the dipolar coupling which connects many. Further, the strength of the spin couplings in liquids is smaller; e.g. a large value of J is 250 Hz for a CH group in a liquid whereas a typical value of dipolar coupling for a CH group in a solid is 50 kHz. The J coupling manifests itself by generating slowly varying periodic spin precessions characterized by well-defined frequencies, whereas the dipolar coupling leads to a rapid monotonic realignment of spin polarization. For this reason, the dipolar thermal equilibration techniques which make the method of Gibby et al. effective in solids cannot be extended to liquids where the weaker J coupling causes oscillatory behavior.

The widespread practical use of cross-polarization techniques for solids compared to liquids indicates the difficulty of enhancing NMR signals in liquids. The weakness and coherent nature of the J coupling generates a type of behavior which has no analog in the dipolar situation. Thus, liquid state methods modeled after dipolar techniques encounter serious obstacles. Use of J coupling requires different approaches if liquid state cross-polarization is to be an effective, practical method.

SUMMARY OF THE INVENTION

It is, therefore, an object of the present invention to provide reliable methods for transferring nuclear spin polarization from one spin species to another in liquids.

Another object of the present invention is to improve substantially the speed with which useful, high-resolution NMR signals are obtained from liquids.

An additional object of the invention is to render the polarization transfer less sensitive to the rf power levels, rf frequency, and rf pulse durations.

A further object of the present invention is to render the transfer of nuclear spin polarization less sensitive to spectrometer imperfections.

A further object of the present invention is to render the transfer of nuclear spin polarization independent of the specific characteristics of the spin species involved in the polarization transfer.

A still further object of the present invention is to transfer nuclear spin polarization among three or more spin species.

These and other objects are achieved by polarizing the spins of at least one nuclear species in a liquid sample containing more than one species, by spin-locking the polarization of this species along a certain direction, by transferring the spin polarization of the first species to at least one other species through the manipulation of the amplitude and/or phase of rf fields applied to one or both species, and detecting directly the NMR signal from the second species.

BRIEF DESCRIPTION OF THE DRAWINGS

FIG. 6 is a graphical representation of the variation of the cross-polarization signal with resonance offset.

FIG. 7 is a graphical representation of the $^{15}N$ spectra of formamide, N-methyl formamide, and N, N-dimethyl formamide.

DETAILED DESCRIPTION OF THE INVENTION

The liquid state cross-polarization NMR technique of the invention begins in the same manner as the various solid state cross-polarization NMR techniques. Nuclear polarization is developed in the sample by leaving it unperturbed in a strong magnetic field, with an intensity designated as $B_o$. Thereupon, at least one species (e.g., I species) is spin-locked by, e.g., the application of a resonant $\pi/2$ rf pulse followed by an rf irradiation that is phase shifted by 90°. The $\pi/2$ pulse is defined conventionally as a pulse of duration $t_{90}$ which equals $(\pi/2)/\gamma_I B_{1I}$ wherein $\gamma_I$ is the magnetogyric ratio of the I species, $B_{1I}$ is $\frac{1}{2}$ of the peak amplitude of the applied linearly polarized rf field, and $\gamma_I B_{1I}$ is referred to as the I nutation rate. At this point, the I polarization, i.e., the polarization of the species first polarized, has been transferred into preferential alignment along the rf field applied to the I species in the reference frame rotating at $\omega_{oI} = \gamma_I B_o$.

Efficient transfer of the spin-locked polarization to at least one other species is achieved by modulating the amplitude and/or phase of the rf irradiation applied to these species. This advantageously manipulates spin-spin coherences generated by the J coupling so as to produce a polarization transfer e.g., I to S, under conditions where transfer produced by prior methods would be substantially reduced.

This technique renders the efficiency of polarization transfer less sensitive to the precise matching of the values of the nutation rates, to the relationship between pulse timing and the specific value of J, and to differences between Larmor and irradiation frequencies. Since efficient transfer is achieved even under these non-ideal conditions, the method permits using cross-polarization in liquid state NMR on a routine basis. This technique reduces the time required to obtain NMR spectra for low $\gamma$ species presently being examined. More importantly, it opens the possibility of performing routine NMR analysis on many low $\gamma$ species which have not been extensively examined, due to prohibitively long accumulation times heretofore required to obtain usable spectra. In addition to signal enhancement, the polarization transfer may be used to transfer polarization from a low $\gamma$ to a high $\gamma$ species to determine which high $\gamma$ species may be coupled to the lower $\gamma$ species. Further the polarization transfer may be applied successively, so that one may transfer from species A to B, then from species B to C, thus effecting the transfer from A to a final species C in a stepwise manner.

Figure 1A:
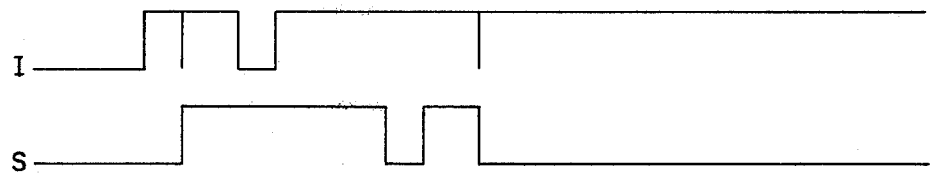
FIGS. 1a-f are graphical representations of the rf pulse sequences of several embodiments of the present method of NMR analysis.

One embodiment, referred to as refocussed J cross-polarization (RJCP), requires that the rf irradiation to one species is switched off for $t_{90}$ (duration of a $\pi/2$ pulse) at a point about a quarter into the cross-polarization sequence and then the rf irradiation to the other species is switched off for $t_{90}$ at a point about three quarters into the cross-polarization cycle. Preferably, the respective nutation rates are to be matched according to: $\gamma_I B_{1I} = \gamma_S B_{1S}$, but the tolerance for a mismatch is much greater than for the earlier methods of Hartmann and Hahn and Maudsley et al. The optimal cross-polarization time is 4/J, but considerable latitude ($\pm 25\%$) exists with this time. The NMR signal from the S spins is then observed at the end of the cycle by conventional means. The pulse sequence for this technique is shown in FIG. 1a, wherein the rf irradiation is first removed from the S species and then from the I species. In this figure, as in the other pulse sequence figures, the vertical axis represents the field amplitudes of the I and S rf irradiations or the nutation rates (which are proportional to field amplitudes) and the horizontal axis represents elapsed time. The cross-polarization time is determined from the J values of the liquid sample under study. Further details of this technique are found in G. C. Chingas, A. N. Garroway, et al. in *J. Mag. Res.* 35, 283-8 (1979) which is hereby incorporated by reference. This technique has particular use in systems with short relaxation times on the order from the reciprocal of the J coupling to a few times larger; in specimens containing a number of coupled spin systems characterized by different J coupling strengths and/or varying numbers of coupled spins; and in situations where precise matching of nutation rates is difficult to achieve.

Figure 1B:
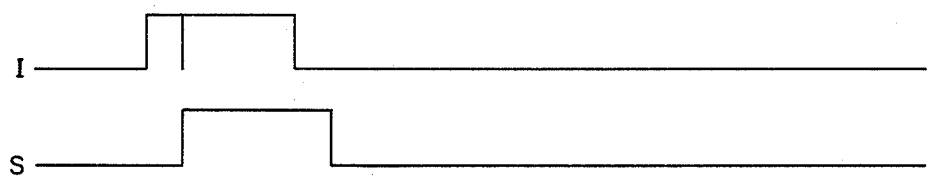

In another embodiment referred to as phase-corrected J cross-polarization (PCJCP), the coupled spectrum (without I decoupling) is observed at the end of a cross-polarization sequence. Liquid state cross-polarization generates phase shifts of the spectral lines within a multiplet; so, it is necessary to phase them identically in order to determine more easily the J coupling. This correct phasing is achieved with an extension pulse, preferably of length $t_{90}$, applied to either of the two rf fields or alternatively by applying a 90° phase-shifted rf extension pulse, preferably of length $t_{90}$, to the detected species. The pulse sequence for this technique is shown in FIG. 1b, wherein the detected species is the S species. A more detailed discussion of this technique is presented in G. C. Chingas, R. D. Bertrand et al. in *J. Am. Chem. Soc.* 110, 4058-59 (1979), which is incorporated herein by reference.

Adiabatic transfer of polarization from one spin species to another spin species or, instead, to a state of J order (namely corresponding to the relative polarization of S spins with respect to the alignment of the coupled I spins), is useful to render the polarization transfer independent of the particular value of the J coupling. Such techniques (FIGS. 1c-1f) require modulation of the rf levels in times which are at least two times longer than the value of 1/J. A number of cross-polarization variations can adiabatically transfer polarization.

Figure 1C:
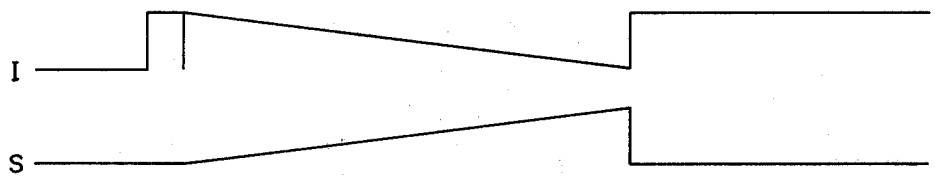

According to the variation whose pulse sequence is shown in FIG. 1c, the amplitude of the spin-locking rf field applied to the I spins is slowly reduced to a value greater than 2J while the amplitude of the rf field to the S spins is raised to a value of at least 2J greater than the instantaneous value of the amplitude of the rf field to the I spins. In FIG. 1c, the rf amplitudes for both species are changed by an amount greater than 2J. During the amplitude modulation, certain level populations of the I and S spins interchange, leading to an enhanced S polarization at the end of the cycle. Thereupon, the rf field to the S spins is turned off and the signal is observed. This method is useful for polarization transfer in complex samples having several I-S spin systems with different J values and different chemical shifts.

Figure 1D:
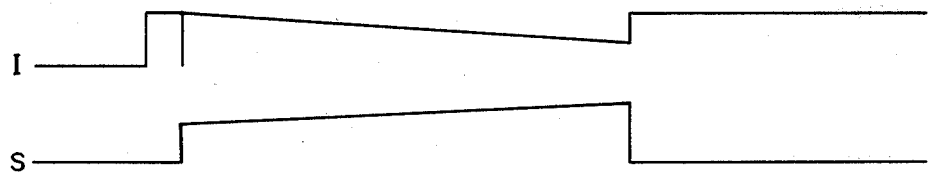

Another sequence of amplitude modulations which can adiabatically transfer polarization between two species is shown in FIG. 1d. The crossing in this figure is more shallow than in FIG. 1c. This shallow crossing variation is a useful variant of that shown in FIG. 1c since it extends the range of coupling strength to lower J values with only a slight reduction in chemical shift range. In both of the variations shown in FIGS. 1c and 1d, one of the rf levels may be held constant (not shown).

Figure 1E:
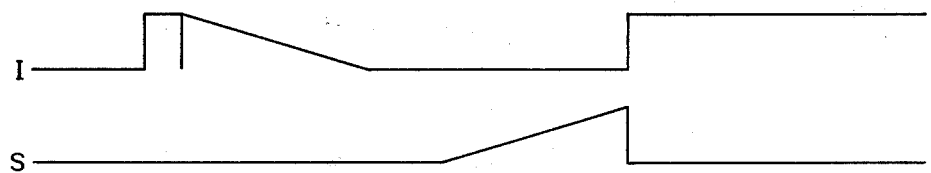

In the variation whose sequence of steps is shown in FIG. 1e, the rf field to the I spins is reduced to zero, followed by an increasing rf field to the S spins to a value of at least 2J. Here the I spin polarization is transferred into J order which is then transferred adiabatically into the S spin polarization.

Figure 1F:
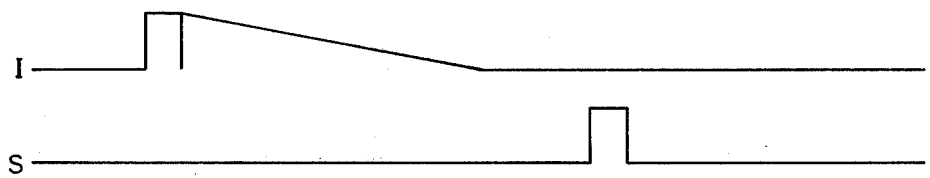

An adiabatic spin-lock polarization transfer can also be achieved by reducing the amplitude of the rf field of the I species to zero and applying, at that point, an intense $\pi/2$ rf pulse to the S spins, as shown in FIG. 1f. The resulting S spin polarization is observed without I spin decoupling; that is used to obtain enhanced coupled multiplet spectra.

Methods 1e and 1f are useful for selective transfer of polarization in I-S systems having both rf frequencies within J of resonance (1e), or with only the I rf frequency within J of its resonance (1f). Methods 1e and 1f are discussed further in A. N. Garroway and G. C. Chingas, *J. Mag. Res.* 38, 179-184 (1980) which is incorporated herein by reference.

Figure 2:
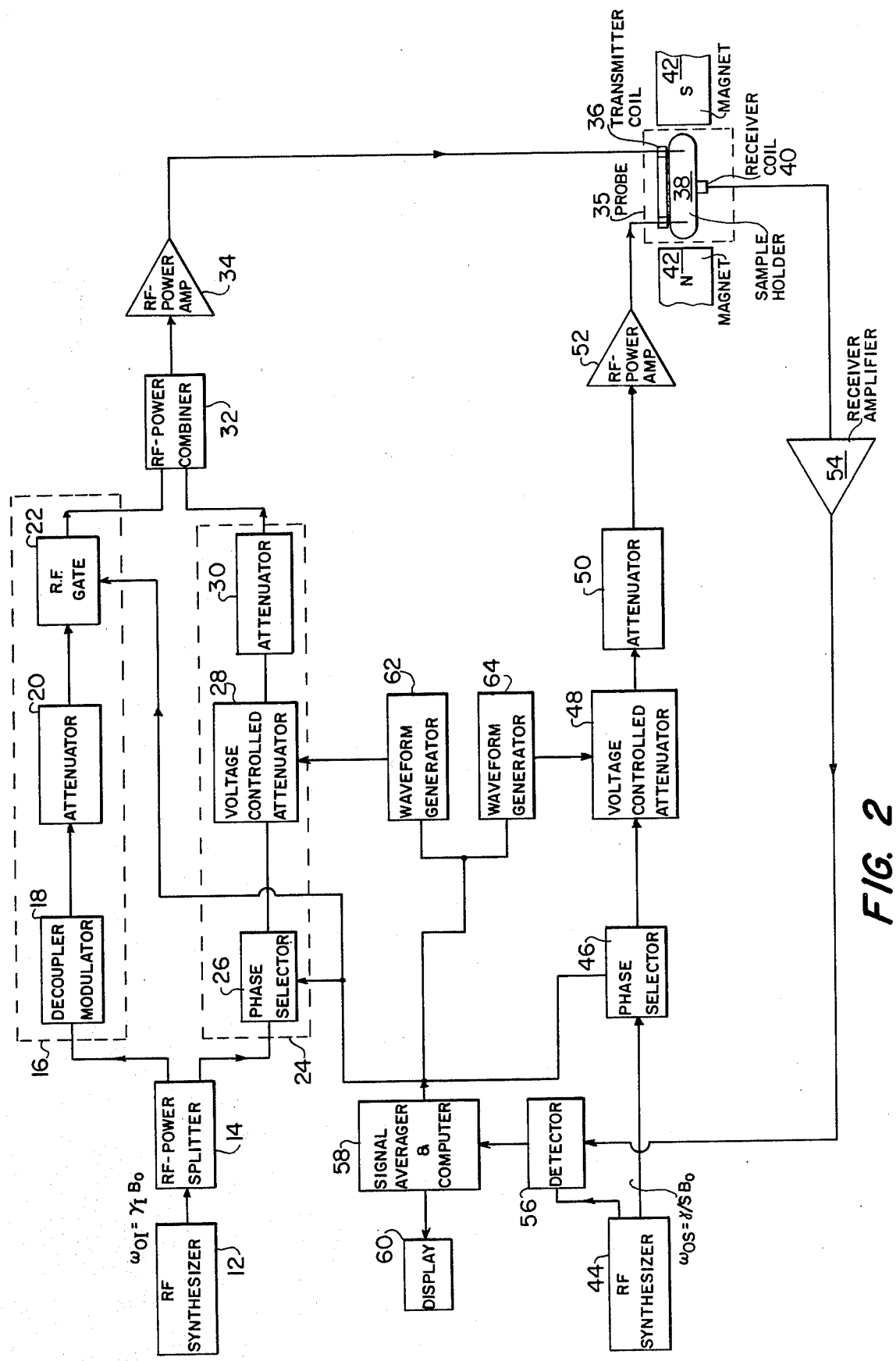
FIG. 2 is a block diagram of the present NMR spectrometer.

The apparatus of the present invention is shown in FIG. 2. It is a two channel spectrometer with a special waveform generator attached to each channel, thereby permitting a controlled modulation of the amplitude and/or phase of the rf carriers to one or all nuclear species under study. Essentially, the waveform generator provides for the simultaneous and independent shaping of the rf fields for both species.

One channel provides an rf carrier to the I species and permits I spin decoupling during data acquisition. It comprises an rf synthesizer 12, an rf power splitter 14, a decoupler subchannel 16, a cross-polarization subchannel 24, an rf power combiner 32, and an rf power amplifier 34.

The rf synthesizer 12 generates an rf carrier of $\omega_{oI} \simeq \gamma_I B_o$ which passes through the rf power splitter 14 for dividing the carrier into two subchannels. One subchannel is the I spin decoupler channel 16 which provides a high-intensity rf pulse to eliminate the effects of the J coupling during data acquisition. The subchannel comprises, in series, a decoupler modulator 18 for providing efficient decoupling of the I spins by noise or phase modulation, an attenuator 20 for setting the rf decoupler level to insure narrow spectral lines, and an rf gate 22 for passing the decoupler carrier when desired.

The other subchannel is the cross-polarization subchannel 24 which produces the rf pulses by setting the phase, amplitude, and timing of the cross-polarizing carrier. It comprises, in series, a phase selector 26 which provides a choice of four phase nominally in quadrature, a voltage controlled attenuator 28 which modulates the amplitude of the cross-polarizing carrier and an annenuator 30 which sets the level of the rf amplitude in the cross-polarization process and should have a setability of at least 0.1 dB.

Signals processed by the two subchannels are combined by an rf power combiner 32. Connected to the rf power combiner 32 is an rf power amplifier 34 for producing sufficiently strong rf fields at sample probe 35.

The sample probe 35 comprises a sample holder 38 for containing the sample, a transmitter coil 36 attached to holder 38 for generating the rf magnetic field from the electrical pulse of amplifier 34 and transmitting that field to the sample, and a receiver coil 40 attached to the sample holder for detecting the NMR signal from the S spins in the sample. The sample probe is physically located between the poles of a magnet 42 which produces the strong homogeneous constant magnetic field of amplitude $B_o$.

The S channel is similar to the cross-polarization subchannel 24 of the I channel. It comprises, in series, a synthesizer 44, producing a signal $\omega_{oS} \simeq \gamma_S B_o$, a phase selector 46, a voltage-controlled attenuator 48, an attenuator 50, and a rf power amplifier 52. The individual components of the S channel perform identical functions as do their counterparts in the I channel. The output of the S channel is fed to the transmitter coil 36 in the same manner as the output of the I channel.

The receiver coil 40 of the sample probe is connected to a computer 58 through a receiver amplifier 54 and a phase-sensitive detector 56 that demodulates the rf NMR signal (MHz) to audio frequencies (kHz) by using the S carrier from rf synthesizer 44 as a reference. The computer performs Fourier transformations of the signals and other signal processing before relaying them to a display 60. This computer also modulates the rf carrier in the I and S channels by controlling phase selectors 26 and 46 and waveform generators 62 and 64 which convert the computer pulses into analog voltages used to control the cross-polarization sequences.

Figure 3:
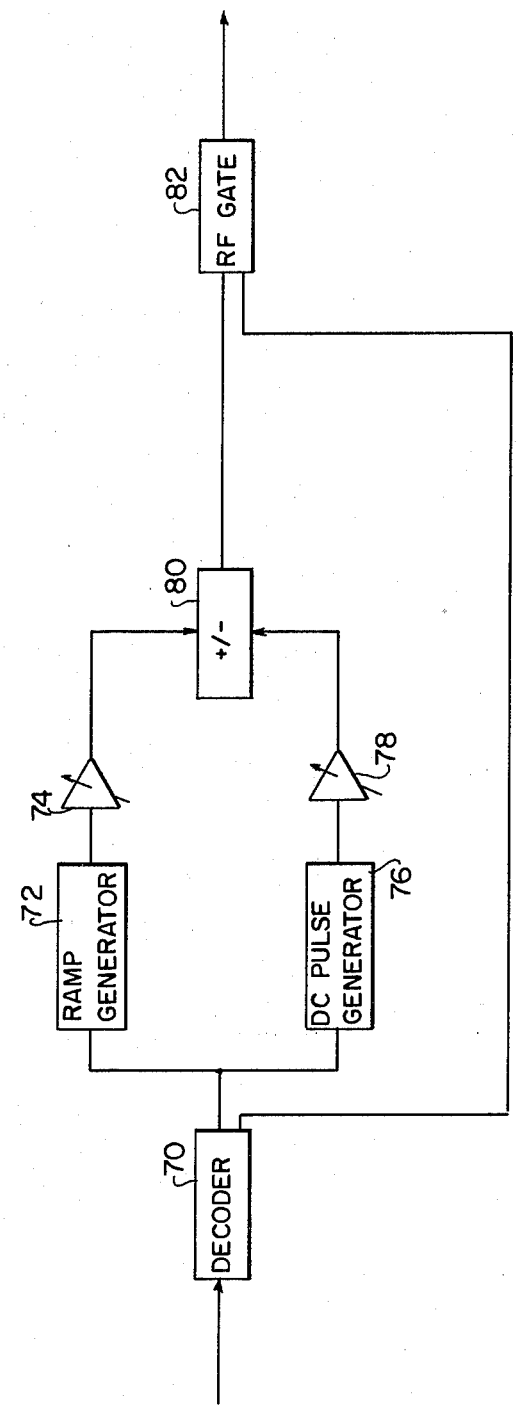
FIG. 3 is a block diagram of the waveform generator utilized in the present NMR spectrometer.

FIG. 3 is a schematic representation of waveform generator 62 or 64 for controlling the cross-polarization sequences of the I or S channel. It comprises a decoder 70, a ramp generator 72, a dc pulse generator 76, and an adder/subtractor 80, and an rf gate 82. In operation the decoder 70 receives commands from computer 58 (not shown) and converts them into analog signals. Output signals from decoder 70 pass through ramp generator 72 for producing a ramp of an adjustable height, the duration of which being determined by the computer, and through the dc pulse generator 76 for producing a voltage pedestal of adjustable amplitude having the same duration as the ramp. Generators 72 and 76 have manual amplitude adjusters 74 and 78 attached to them in order to provide operator control of the waveform shape. The signals, coming from the generator, pass through an adder/subtractor 80 which combines the two voltages to produce a rising or falling ramp, offset by a voltage pedestal, and then pass to an rf gate which controls the signal of the voltage-controlled attenuator 28 or 48 of the I or S channel (not shown). If the rf pulse does not need to be modulated slowly, the command output from decoder 70 is passed directly to rf gate 82 as shown. Such waveform modulation is especially useful on the pulse sequences shown in FIGS. 1a to 1f.

Several advantages of the present invention are shown in the following examples. It is understood that these examples are given by way of illustration and are not intended to limit the specification or the claims to follow in any manner.

EXAMPLE I

Reduction of Sampling Time

Figure 4:
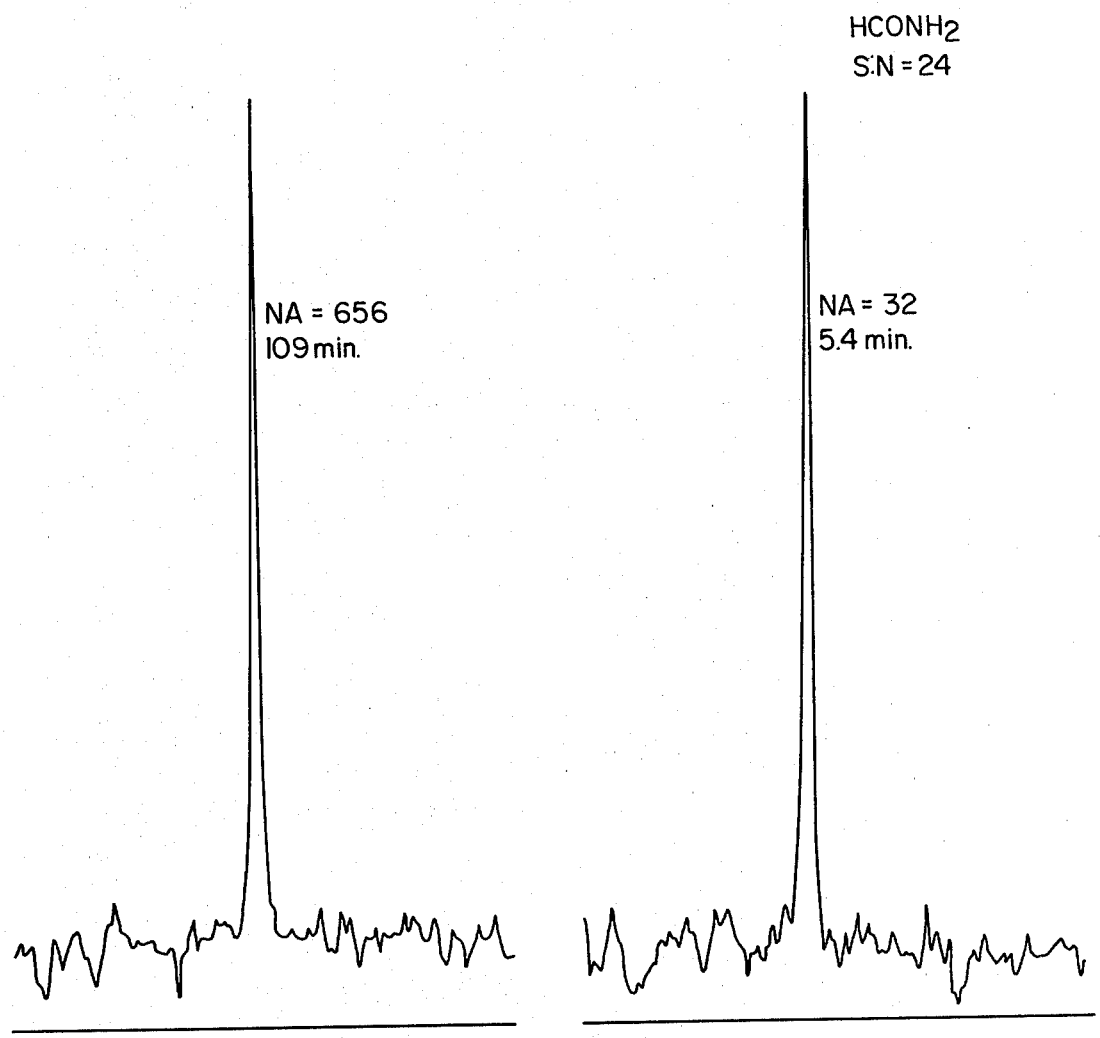
FIG. 4 is a comparison of the $^{15}N$ resonance in formamide obtained in both the standard single pulse method and the subject NMR method.

The $^{15}N$ resonance in formamide (HCONH$_2$) of natural isotopic abundance was obtained by both the standard, single $\pi/2$ pulse method and the cross-polarization method and is illustrated in FIG. 4. The $^{15}N$ Larmor frequency was 10 MHz. Sample tubes of 5 mm diameter were used with the spectra lines artifically broadened to 2 Hz and the pulse sequences of both methods were repeated every 10 sec. The single $\pi/2$ pulse method required 109 minutes to build up the same signal-to-noise ratio achieved after only 5.4 minutes of averaging by the cross-polarization sequences, as shown in FIG. 4. All of the various pulse sequences encompassed by the present invention gave similar improvements.

EXAMPLE II

Insensitivity to Nutation-Rate Equality

Figure 5:
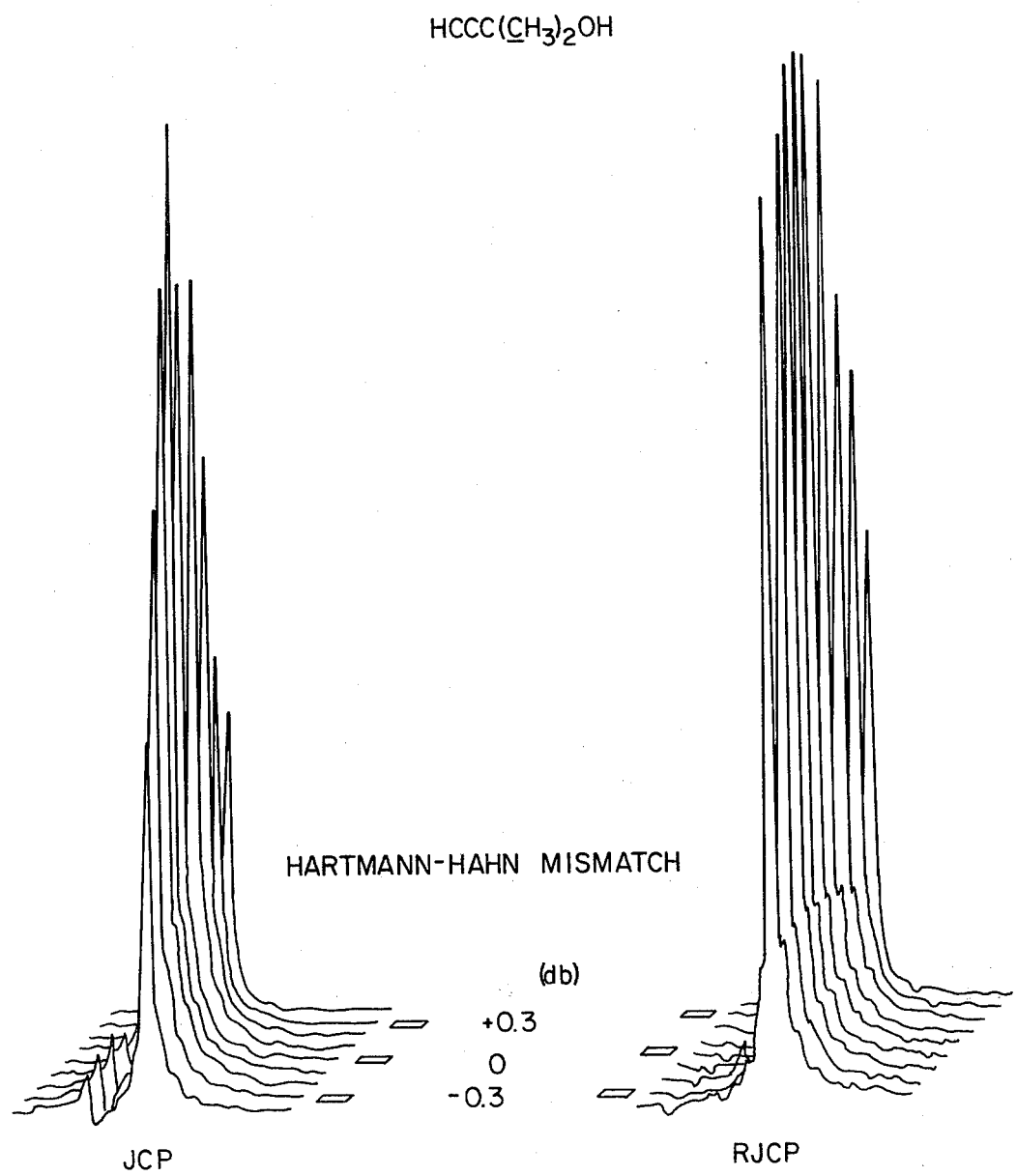
FIG. 5 is a graphical comparison of the cross-polarization signal of methyl carbons of dimethyl propargyl alcohol obtained by the present NMR technique and by the standard method for a nutation-rate ($\gamma B_1$) mismatch of $-0.3$ to $0.3$ db.

A major disadvantage of previous liquid state, cross-polarization methods, e.g., Hartmann ibid or Maudsley ibid, is the requirement of closely matching the nutation rates or the rf field strength of the I and S species. In FIG. 5, the cross-polarization signal of methyl carbons of HCCC(CH$_3$)$_2$OH obtained with the RJCP pulse sequence illustrated in FIG. 1a is plotted with the signal obtained by the standard method for nutation rate mismatchs of $-0.3$ to $+0.3$ db. The rf fields of the two species produce a precession rate of $\nu_1 = 3$ kHz ($\nu_1 = \gamma B_1/2\pi$) at 0 db. The refocused J cross-polarization (RJCP) method of FIG. 1a is clearly superior, allowing a mismatch of $\pm 0.3$ db while the previous method tolerates only a $\pm 0.1$ db mismatch before the signal drops to 80 percent of its original height.

EXAMPLE III

Insensitivity to Resonance Offset

A major advantage of the adiabatic cross-polarization technique illustrated in FIG. 1c is the insensitivity to resonance offset. The $^{15}N$ signal from a 5 mm diameter sample tube of 95% enriched acetamide (CH$_3$CONH$_2$) was examined by a variation of the method illustrated in FIG. 1c. The proton rf field was ramped from 1200 to 600 Hz while the nitrogen rf field remained constant at 750 Hz. To show insensitivity to resonance offset, the $^{15}N$ signal was measured while stepping the nitrogen frequency in 100 Hz increments. As FIG. 6 shows, the cross-polarization signal is virtually insensitive to resonance offset out to about ±800 Hz. This is about a 200 percent improvement over the results obtained with the previous techniques under similar conditions, for which one expects a range of only about ±250 Hz.

EXAMPLE IV

Insensitivity to the Exact Value of the J Coupling

Earlier cross-polarization methods required a foreknowledge of the approximate size of J. For widely different values of J, separate experiments, each optimized for a particular J, are required. This is overcome in the present method.

The $^{15}N$ spectra of an equal volume mixture of formamide, N-methyl formamide, and N, N-dimethyl formamide were determined by the adiabatic technique illustrated in FIG. 1d. The dominant NH coupling constants are 89, 94 and 15 Hz, respectively. The appearance of the resonance with a low J along with the two with higher J values indicates that the adiabatic J cross-polarization (AJCP) sequence of FIG. 1d is virtually insensitive to the exact value of J. The data are shown in FIG. 7.

EXAMPLE V

Selective Cross-Polarization

The pulse sequence of FIG. 1f prepares the spin system in a state which is aligned by the J coupling. This state of J order can be observed directly as in 1f. Further, by adiabatic remagnetization in the rotating frame, as in the sequence of 1e, the J order can be transferred to the S spin lock magnetization, leading, under certain conditions, to a S signal enhanced by essentially the same factor as all the other sequences of FIG. 1. One advantage of sequence 1e is that only those S spins which are coupled to I spins within J/2 of the I irradiation frequency will be cross-polarized. This selectivity provides a means of simplifying the interpretation of complex spectra, while still achieving an enhanced signal from the nuclei of interest.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for NMR spectroscopic analysis of liquids having at least two nuclear spin species which comprises:
   subjecting said liquid to a magnetic field;
   transferring pin polarization from at least one nuclear species to at least one other nuclear species by the steps comprising:
   spin-locking at least one species by rf irradiation;
   modulating the amplitude and/or phase of said spin locking rf irradiation; and
   applying other rf irradiation that varies in amplitude and/or phase to at least one other nuclear species so that spin polarization is transferred from said spin-locked nuclear species to said other species; and
   detecting directly the NMR signal from said other species.

2. The method of claim 1 wherein said spin polarization is transferred to two or more nuclear species in sequence.

3. The method of claim 1 wherein spin polarization is transferred from a species with a higher magnetogyric ratio to one with a lower ratio thereby enhancing the signal strength of the second species.

4. The method of claim 1 wherein spin polarization is transferred by the steps comprising:
   spin-locking one nuclear species by rf irradiation;
   applying rf irradiation to a second species;
   setting the total time for said polarization transfer to be about 4/J;
   removing, for a duration of about $t_{90}$, rf irradiation from either said nuclear species at a time about one fourth of the way into the polarization transfer; and
   removing, for a duration of about $t_{90}$, rf irradiation from said other nuclear species at a time which is about three fourths into the polarization transfer.

5. The method of claim 1 in which the step of transferring spin polarization further comprises:
   applying an extension pulse to the rf irradiation to either spin species while turning off the rf irradiation to the spin species.

6. The method of claim 5 wherein said extension pulse is applied 90° out of phase with the rf irradiation to the species to which said extension pulse is applied.

7. The method of claims 5 or 6 wherein extension pulse is applied for a duration of about $t_{90}$.

8. The method of claim 1 wherein said spin polarization is transferred adiabatically.

9. The method of claim 8 wherein said spin polarization is adiabatically transferred by the steps comprising:
   spin-locking at least one species by rf irradiation with an amplitude such that the nutation rate is at least 2 times greater than J;
   decreasing slowly the amplitude of said spin-locking rf irradiation;
   simultaneously applying rf irradiation with an amplitude initially smaller than the amplitude of said spin-locking rf irradiation to another species;
   increasing slowly the amplitude of said irradiation to said other species until the amplitude of said irradiation is at least 2J greater than the instantaneous amplitude of said spin-locking rf irradiation;
   removing said rf irradiation to said other species.

10. The method of claim 9 wherein the amplitude of said rf irradiation to either species is changed by an amount greater than about 2J.

11. The method of claim 9 wherein the amplitude of said rf irradiation to each species is changed by an amount greater than about 2J.

12. The method of claim 9 wherein the changes in one of the of the rf irradiation amplitude is about 2J and the duration is about 5 times longer than 1/J.

13. The method of claim 9 wherein said irradiation to said other species is constant.

14. The method of claim 8 wherein said spin polarization is transferred adiabatically by the steps comprising:
   spin-locking at least one nuclear species by rf irradiation;
   reducing the amplitude of said spin locking rf irradiation to zero;
   applying other rf irradiation to at least one other nuclear species after the amplitude of said spin locking rf irradiation becomes zero; and increasing the amplitude of said other rf irradiation to at least 2J.

15. The method of claim 8 wherein said spin polarization is transferred adiabatically by the steps comprising:
spin-locking at least one nuclear species by rf irradiation;
reducing the amplitude of said spin locking rf irradiation to zero; and
applying a $\pi/2$ rf pulse to one nuclear species.

16. In a two-channel spectrometer wherein two rf carriers are generated and applied to nuclear species in a liquid sample, the combination, with each channel, which comprises means for modulating the amplitude of each carrier.

17. The spectrometer of claim 16 wherein said modulating means comprises:
a programmed computer; and
means for converting digital pulses received from said computer into dual channel voltage ramps of settable slope and dc level.

* * * * *